(12) United States Patent
Jun

(10) Patent No.: US 6,922,069 B2
(45) Date of Patent: Jul. 26, 2005

(54) NEEDLE ASSEMBLY OF PROBE CARD

(75) Inventor: Tae-Un Jun, Seoul (KR)

(73) Assignee: Yulim Hitech, Inc. (KR)

( * ) Notice: Subject to any disclaimer, the term of this patent is extended or adjusted under 35 U.S.C. 154(b) by 0 days.

(21) Appl. No.: 10/742,122

(22) Filed: Dec. 19, 2003

(65) Prior Publication Data
US 2004/0201389 A1 Oct. 14, 2004

(30) Foreign Application Priority Data
Apr. 11, 2003 (KR) .................... 10-2003-0022937

(51) Int. Cl.⁷ ............................................. G01R 1/073
(52) U.S. Cl. ...................................... 324/762; 324/754
(58) Field of Search ................................ 324/762, 754, 324/758, 760

(56) References Cited

U.S. PATENT DOCUMENTS

| | | | | |
|---|---|---|---|---|
| 4,961,052 A | * | 10/1990 | Tada et al. ................ | 324/754 |
| 5,172,050 A | * | 12/1992 | Swapp ...................... | 324/762 |
| 5,555,422 A | * | 9/1996 | Nakano ..................... | 324/754 |
| 6,114,864 A | * | 9/2000 | Soejima et al. ............ | 324/754 |
| 6,507,204 B1 | * | 1/2003 | Kanamaru et al. ......... | 324/754 |
| 6,696,849 B2 | * | 2/2004 | Ban et al. .................. | 324/760 |
| 6,724,204 B2 | * | 4/2004 | Cho et al. .................. | 324/754 |

* cited by examiner

Primary Examiner—Ernest Karlsen
(74) Attorney, Agent, or Firm—Dilworth & Barrese LLP

(57) ABSTRACT

A needle assembly of probe card includes a plate and needles formed therein for enhancing an assembly characteristic and productivity and increasing an exact and reliable characteristic test. The plate is provided with holes that are formed with an insulating film on an inner side surface thereof. One side end surface of the needle adheres on an inner side surface of the hole, another side end surface thereof is spaced from an inner side surface of the hole, and a vertical thickness of the other side of the hole is formed thinner than the plate so as to have a space in which the other side can vertically move upwardly and downwardly. The plate and the needle are integrated.

5 Claims, 2 Drawing Sheets

NEEDLE ASSEMBLY OF PROBE CARD

PRIORITY

This application claims priority to an application entitled "Needle Assembly of Probe Card" filed in the Korean Industrial Property Office on Apr. 11, 2003 and assigned Serial No. 2003-22937, the contents of which are incorporated herein by reference.

FIELD OF THE INVENTION

The present invention relates to a characteristic test for semiconductor devices, and more particularly, to a needle assembly of probe card for performing a stabilized characteristic test for miniaturized and high-integrated semiconductor devices.

DESCRIPTION OF THE RELATED ART

Semiconductor devices are generally manufactured through fabrication processes for forming patterns on wafers and assembly processes for assembling the pattern-formed wafers into respective chips.

Between the fabrication processes and the assembly processes, an electrical die sorting (hereinafter, referred to as 'EDS') process is generally performed to test electrical characteristics of the respective chips formed on a wafer.

The EDS process is applied particularly to sort defective chips from the normal chips formed on the wafer, and employs a test apparatus for detecting the defective chips by simply applying electric signals to the chips in the wafer and using the resultant electric signals. That is, in order to perform the electric test for the chips in the wafer, a probe card is provided therein with a plurality of needles which contact the patterns of each chip and through which the electric signals are applied to the chip.

If the semiconductor device tested shows a good quality by the probe card, the semiconductor device is transferred to post processes such as a packaging process etc., so that the semiconductor devices are manufactured as final products by the packing process.

During the electrical characteristic test of the semiconductor device, a needle of the probe card is in contact with an electrode pad of each semiconductor device that is generally formed on a wafer, and a specific current from a specific tester flows through the needle so as to measure and detect the electrical characteristic.

Recently, semiconductor devices are being continuously developed for a high integration and an extremely miniaturized size. Therefore, test apparatuses have been required for testing the semiconductor devices on this tendency and there have been many attempts to properly perform the test of high-integrated semiconductor devices with probe cards of the apparatuses.

As a result, such conventional test apparatuses of the semiconductor devices decrease interval or spacing between needles, and also shorten the transmission path of electric signals, when the needles contact an electrode pad of the semiconductor device from a main substrate.

However, for the test apparatus for testing the high-integrated semiconductor devices, a thickness of the needles needs to be as small as possible and the spacing between these needles having such a minimized thickness also needs to be narrower.

In order to make the thickness of needles and the spacing between the needles small, components for supporting these needles should be formed with a fine pattern, and further requires a configuration that is capable of stably transferring electric signals from the main substrate to these finely formed needles. A very complicated and delicate process technique is therefore needed to realize this configuration.

SUMMARY OF THE INVENTION

One feature of the present invention provides a needle assembly of a probe card that is appropriately employed for testing high integrated and miniaturized semiconductor devices according to a current technical tendency, by making the thickness of needles and spacing between the needles smaller.

Another feature of the present invention is to provide a probe card to reduce the number of assembling processes and increase productivity by unifying needles being contacted with electrode pads of a semiconductor device and components supporting the needles into a needle assembly.

To realize these features, according to one aspect of the present invention, a needle assembly of probe card includes a plate and needle formed therein. The plate is a thin plate made of silicon material and is formed therein in predetermined intervals with holes having a predetermined width and length, and an insulating film of a predetermined thickness is formed at an inner side surface of each of the holes. One side of the needle adheres to one side of the hole, and another side end surface thereof is spaced in a predetermined gap from an inner side surface of the hole, and a vertical thickness of another side excluding one-side end part adhering to the one side surface of the hole is formed thinner than the plate, so as to have a space in which the another side can vertically move upward and downward.

According to another aspect of the present invention, a needle assembly of probe card includes a plate, a needle and a circuit substrate. The plate is a thin plate made of silicon material and is provided with holes that have predetermined widths and lengths spaced from each other in predetermined intervals, the inner side of the holes being provided with an insulating film that is formed with a predetermined thickness on an inner side face thereof. Further, in the needle, one side end surface thereof adheres on one side face of a length direction of the hole, and another-side end surface thereof have a predetermined gap from an inner side surface of the hole, and a vertical thickness of another side excluding one-side end part adhering to the one side face of the hole is formed thinner than the plate, so as to have a movement space in which the another side can vertically move upward and downward. Also, the circuit substrate is formed with a predetermined thickness on an upper part of the plate, and a plate face thereof has a vertical contact hole so as to be electrically connected to an upper part of the needle. Further, on the circuit substrate, a circuit is formed to electrically connect the contact hole portion with a connection pattern formed on an upper face of the circuit substrate.

BRIEF DESCRIPTION OF THE DRAWINGS

The foregoing and other features and advantages of the invention will be apparent from the more particular description of exemplary embodiments of the invention, as illustrated in the accompanying drawings, in which.

DETAILED DESCRIPTION OF EXEMPLARY EMBODIMENTS

The present invention and exemplary embodiments thereof are more fully described below with reference to the accompanying drawings. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

Figure 1:
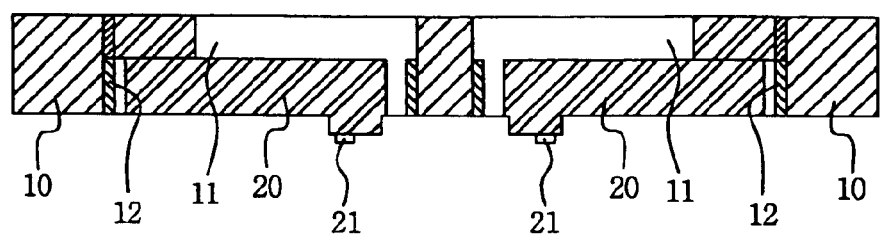
FIG. 1 is a cross-sectional view of a needle assembly according to one exemplary embodiment of the present invention.

FIG. 1 is a cross-sectional view illustrating a needle assembly of a probe card for use in a characteristic test of a semiconductor device according to one exemplary embodiment of the present invention.

A needle assembly of the invention has inventive characteristics that a plate 10 and a needle 20 are integrated into one body.

It is desirable that the plate 10 be made of silicon material and the needle 20 be made of conductive material that is proper to a unified formation with the plate 10.

Describing more in detail, the plate 10 is made of a thin plate of silicon material having a predetermined thickness, and is provided therethrough with holes 11 having a predetermined width and length at predetermined intervals.

The plate 10 is formed with an insulating film 12 having a predetermined thickness on an inner side surface of the hole 11 and on an upper portion and a lower portion of the face of plate 10.

It is desirable that this insulating film 12 is formed of oxide film and silicon nitride film SiN.

The needle 20 is made of conductive material in the present invention. The conductive material is applied by a chemical vapor deposition. For example, nickel or beryllium copper and even other various materials are used.

Figure 2:
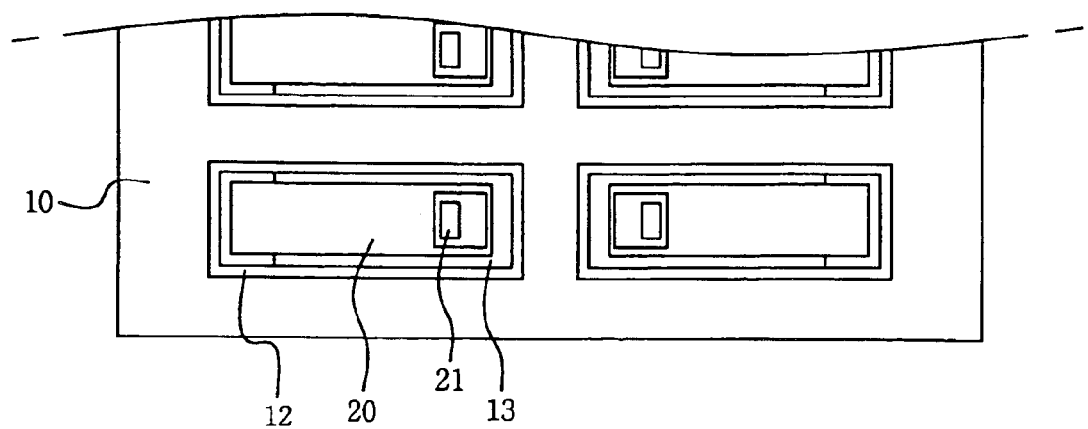
FIG. 2 is a bottom view of FIG. 1.

Describing in more detail the needle 20, one side thereof adheres to one side surface of the hole 11 that is formed in a vertical direction in the plate 10, and another side surfaces thereof are spaced from an inner side surface of the hole 11 to form a gap 13 as shown in FIG. 2. In particular, the needle 20 is formed in a "L" shape and one side of the "L" shape of the needle 20 is fixed to one side of the inner surface of the hole 11, so that the other end side of the needle 20 may move upward and downward.

Further, a needle tip 21 having a given size protrudes downward from a lower surface of the needle 20 opposite to one side of the needle 20 adhering to the plate 10. Since the needle tip 21 contacts a connection pad of a semiconductor device, it is desirable that a lower end part of the needle tip 21 is pointed to thereby be in point contact with the connection pad of the semiconductor device, rather than in surface contact with the connection pad, to reduce a contact resistance through the contact point.

The gap 13 between the insulating film 12 and the another end side being opposite to the one side of the needle 20 which moves upward and downward is formed to have an enough space, so that any contact between the insulating film 12 and the another end side may be prevented when the one side of the needle 20, i.e, the side where the needle tip 21 is positioned, moves upward and downward (such that it may fluctuate upward and downward).

Figure 3:
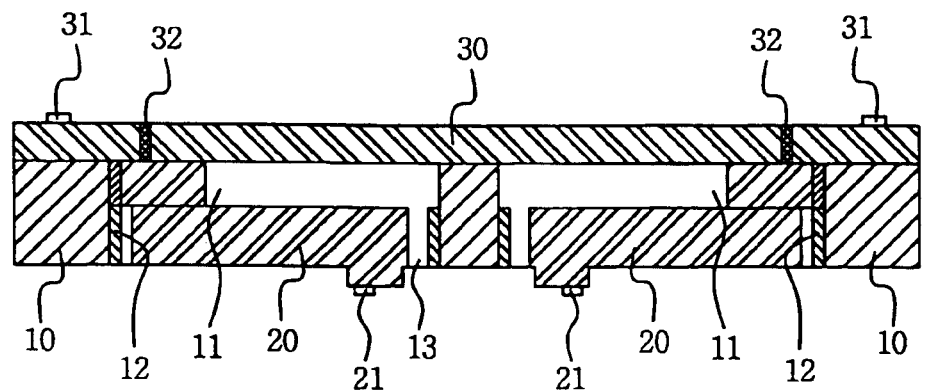
FIG. 3 is a cross-sectional view of a needle assembly according to another exemplary embodiment of the present invention.

Meanwhile, as shown in FIG. 3, a circuit substrate 30 is integrated into the needle assembly of the present invention.

That is, the circuit substrate 30 may be integrated into the needle assembly as one body to be deposited on or adhere to an upper surface of the plate 10, so that an electrical signal is effectively transmitted from a main substrate of the probe card to the needle 20. The circuit substrate 30 is provided with connection pads 31 that are formed on an upper surface thereof and that are electrically connected to an electrical signal connection unit (not shown) equipped on an upper side of the connection pad 31.

In addition, as shown in FIG. 3, the circuit substrate 30 is formed therein with contact portions 32 that are formed by being filled with a conductive material. The contact portion 32 contacts the needle 20 at the upper surface of the needle 20 that contacts the circuit substrate 30. The upper portion of the contact portion 32 is connected with a pattern formed on the circuit substrate 30 so as to electrically communicate with the connection pads 31.

The needle assembly of the present invention is fabricated using a conventional semiconductor device fabricating method. That is, the needle assembly of the present invention may be fabricated by using several processes such as a photolithography process, etching process, a deposition process such as a chemical vapor deposition (CVD), and a polishing process, which have been typically used in fabricating semiconductor devices. For example, the plate 10 of a silicon plane plate having a given thickness is etched to form the holes 11 using a photolithography process and the needle 20 is formed in the inner side of holes 11 by using the deposition process, particularly a low pressure chemical vapor deposition (LPCVD) process. Further, any other processes may be used in fabricating the needle assembly of the present invention.

The insulating film 12, which is formed of a portion contacting and a portion not contacting the L shaped needle 20, is formed by depositing silicon nitride, that is a different material from the needle 20, on an inner side surface of the hole 11 of the plate 10.

A needle tip 21 to contact an electrode pad (not shown) of a semiconductor device protrudes to a predetermined height, from a lower surface of one end part of the needle 20, which moves upward and downward. The needle tip 21 is formed on the needle 20 using a separate deposition process.

The circuit substrate 30 is deposited or mounted on an upper surface of the plate 10 which is integrated with the needle 20.

The circuit substrate 30 is formed thereon with circuit patterns using the photolithography process and the deposition process on the plate 10.

It is desirable that an upper surface and a lower surface of the plate 10 are planarized using a planarization process such as a polishing process.

The operation of the present invention thus constructed will be described as follows.

The present invention has a feature that needle being contacted with an electrode pad of a semiconductor device is integrated into the needle assembly, thereby allowing the distance between the needles to be formed more densely.

Figure 4:
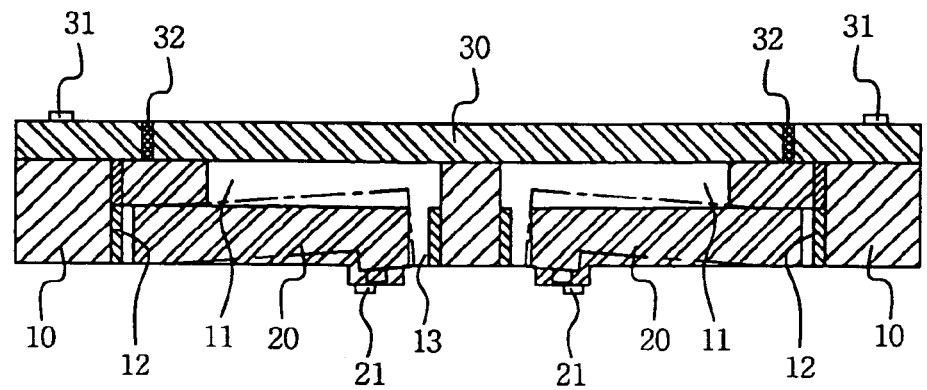
FIG. 4 is a cross-sectional view of the needle assembly in an operational state according to the present invention.

In particular, there is an advantage that the needle 20 provided in the plate 10 moves upward and downward at one end portion thereof by a predetermined angle, as shown in FIG. 4. The needle 20 operates as a buffer against an impact that is caused by a direct contact with an electrode pad of a semiconductor device. Further, in the configuration of the needle assembly, the needle 20 and the circuit substrate 30 are integrated with the plate 10, to perform a convenient assembly process for a subsequent manufacturing process of a probe card.

The conventional needle assembly is fabricated by forming separately and assembling respectively needles, plates supporting the needles, and circuit substrates for transferring an electrical signal to the needles. However, in the present invention, the needle assembly is fabricated by integrating these components in a single body, thereby enabling the needle assembly to be assembled with a probe card more easily.

Accordingly, since the needle assemble of the present invention is fabricated using the accurate and fine processes that are employed in forming patterns of semiconductor devices, the distance between the needle 20 may be decreased, thereby providing a probe card capable of efficiently corresponding to patterns of semiconductor devices that tend to be miniaturized and high-integrated.

As was described above, an assembly of needles contacting an electrode pad of a semiconductor device is integrated and manufactured using pattern forming processes of semiconductor devices, thereby enhancing an assembly characteristic and productivity in manufacturing the probe card, and extremely miniaturizing the needles and substantially decreasing the distance between the needles. Therefore, according to the present invention, even a high-integrated semiconductor device can be tested by an exact characteristic test.

The present invention increases reliability in tests for semiconductor devices, in particular, even for corresponding to extremely miniaturized semiconductor devices.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. Accordingly, these and other changes and modifications are seen to be within the true spirit and scope of the invention as defined by the appended claims.

What is claimed is:

1. A needle assembly of a probe card, comprising:

a plate made of silicon material, said plate being formed therein with holes having a predetermined width and length and spaced from one another at predetermined intervals, an inner side of said holes each being formed with an insulating film having a predetermined thickness on an inner side surface thereof; and a plurality of needles, a surface of one side portion of each of the needles being adhered on one side surface of each of the holes, a surface of another side portion of each of the needles being spaced from an inner side surface of each of the holes by a predetermined gap, the other portion of each of the needles being formed thinner than the needle guide plate in a vertical direction so as to be movable upwardly and downwardly within the hole, wherein said plate and said needles are combined into one body.

2. The assembly as claimed in claim 1, wherein the needle is "L"-shaped, a vertical portion of the "L"-shaped needle adhering to one inner side surface of the hole of the plate, a horizontal portion of the "L" shaped needle being configured to be movable upward and downward.

3. The assembly as claimed in claim 1, wherein the needle is provided with a needle tip that projects downward, a lower surface of the other side portion of the needle being movable upwardly and downwardly.

4. The assembly as claimed in claim 1, wherein the gap between the another side portion of the needle and the insulating film formed on an inner side surface of the plate, is of sufficient width to prevent contact between the insulating film and the another side portion of the needle when the other side portion of the needle moves upwardly and downwardly.

5. A needle assembly of a probe card, comprising:

a plate made of silicon material, said plate being formed therein with holes having a predetermined width and length and spaced from one another at predetermined intervals, an inner side of said holes each being formed with an insulating film having a predetermined thickness on an inner side surface thereof;

a plurality of needles, a surface of one side portion of each of the needles being adhered on one side surface of each of the holes, a surface of another side portion of each of the needles being spaced from an inner side surface of each of the holes by a predetermined gap, the other portion of each of the needles being formed thinner in thickness than the plate in a vertical direction so as to be movable upwardly and downwardly within the hole; and a circuit substrate formed on the plate with a predetermined thickness, the circuit substrate formed therein with contact holes by which the circuit substrate is electrically connected to the needles, the circuit substrate formed thereon with connection patterns electrically connected to the contact holes, wherein said plate, said needles, and said circuit substrate are combined into one body.

* * * * *